United States Patent [19]

Hey et al.

[11] Patent Number: 5,091,217
[45] Date of Patent: Feb. 25, 1992

[54] METHOD FOR PROCESSING WAFERS IN A MULTI STATION COMMON CHAMBER REACTOR

[75] Inventors: H. Peter W. Hey, Phoenix; William A. Mazak; Ravinder K. Aggarwal, both of Mesa; John H. Curtin, Phoenix; Paul B. Brown; Joe R. Smith, both of Tempe, all of Ariz.

[73] Assignee: Advanced Semiconductor Materials, Inc., Phoenix, Ariz.

[21] Appl. No.: 587,737

[22] Filed: Sep. 25, 1990

Related U.S. Application Data

[62] Division of Ser. No. 354,922, May 22, 1989, Pat. No. 4,987,856.

[51] Int. Cl.⁵ .............................................. C23C 16/44
[52] U.S. Cl. ................................ 427/248.1; 118/719; 118/723; 118/725; 118/728; 427/38; 427/45.1; 427/51
[58] Field of Search ............... 118/719, 723, 725, 728, 118/730; 156/345, 643, 646; 414/222; 427/39, 45.1, 50, 51, 38, 248.1

[56] References Cited

U.S. PATENT DOCUMENTS 4,618,542 10/1986 Morita et al. .................... 427/39

FOREIGN PATENT DOCUMENTS

| 59-4028 | 1/1984 | Japan | 156/345 |
| 60-249328 | 12/1985 | Japan | 118/723 |
| 61-198716 | 9/1986 | Japan | 118/723 |
| 62-13573 | 1/1987 | Japan | 118/728 |
| 62-142315 | 6/1987 | Japan | 118/723 |
| 62-281427 | 12/1987 | Japan | 118/728 |
| 63-124514 | 5/1988 | Japan | 118/723 |
| 63-235479 | 9/1988 | Japan | 118/728 |
| WO87/07309 | 12/1987 | PCT Int'l Appl. | 118/723 |

Primary Examiner—Shrive Beck
Assistant Examiner—Terry J. Owens
Attorney, Agent, or Firm—Cahill, Sutton & Thomas

[57] ABSTRACT

Each of a plurality of individually heated circularly located susceptors supports and heats one of a plurality of wafers within a processing chamber. An overhead gas dispersion head, vertically aligned with each susceptor, directs, in combination with downstream flow control structure, flow of a reactant gas radially uniformly across the supported wafer. A spider sequentially relocates each of the wafers, as a group, to an adjacent susceptor. Wafer handling apparatus replaces each processed wafer to provide a high production rate throughput. A source of RF energy radiating essentially primarily between each gas dispersion head and its associated susceptor provides a plasma enhanced environment and the low level intensity elsewhere within the reactor reduces residual deposits.

29 Claims, 5 Drawing Sheets

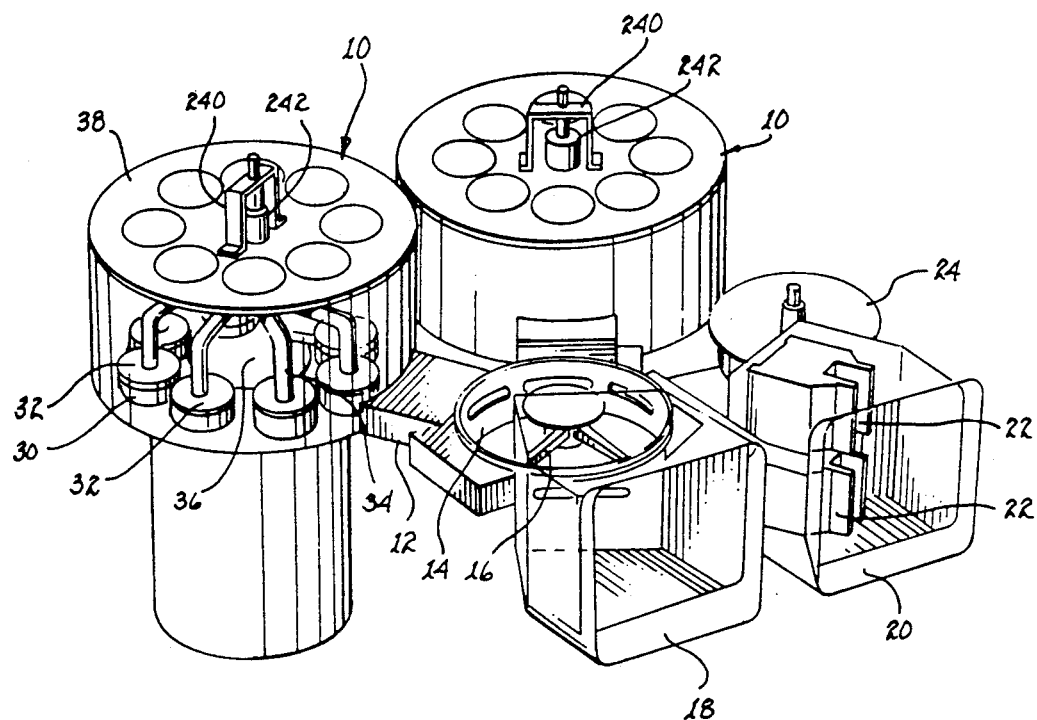
fig. 1
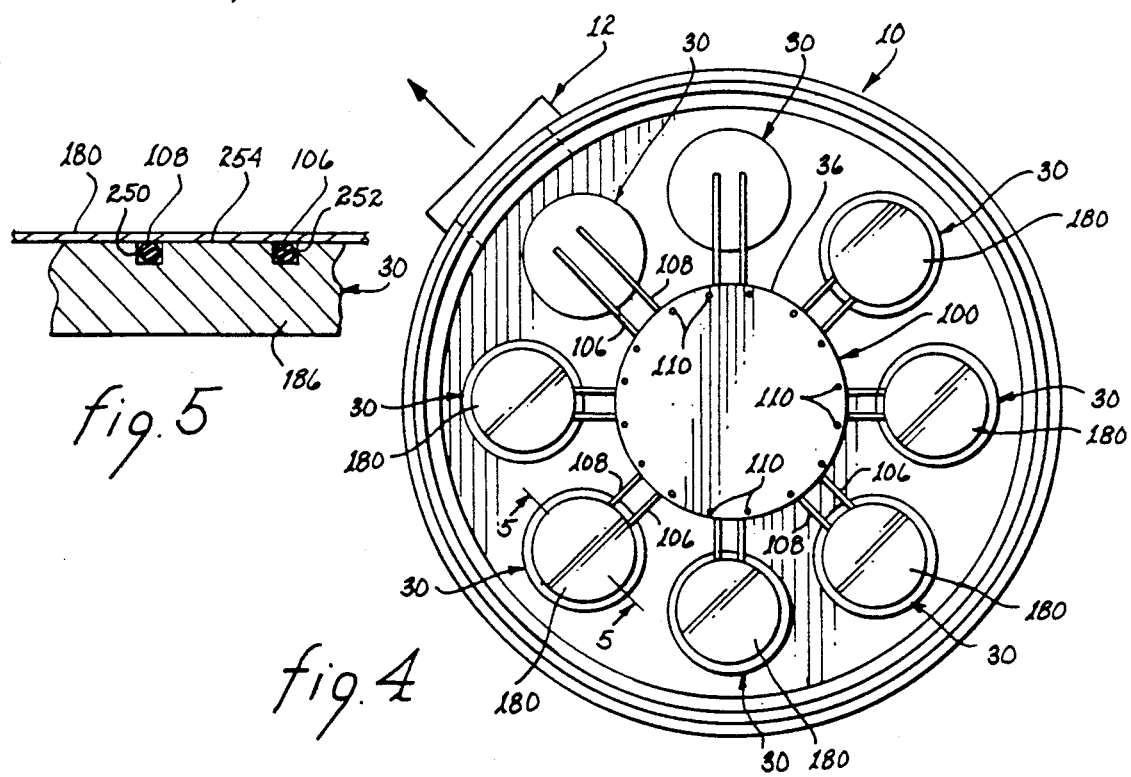
fig. 5
fig. 4

METHOD FOR PROCESSING WAFERS IN A MULTI STATION COMMON CHAMBER REACTOR

This is a division of application Ser. No. 354,922 filed May 22, 1989, now U.S. Pat. No. 4,987,856.

BACKGROUND OF THE INVENTION

1. Field of the Invention

The present invention relates to chemical vapor deposition apparatus and, more particularly, to multi station sequential processing within a common chamber of one or multiple single substrates.

2. Description of the Prior Art

Plasma enhanced chemical vapor deposition (PECVD) methods have been developed relatively recently. Little literature is publicly available and much of that is directed to well known chemistry usable with PECVD rather than being directed to practical high throughput apparatus for implementing the process. PECVD uses an RF (radio frequency) induced gas discharge to transfer energy to the reactant gases which allows a substrate to remain at a lower temperature than other processes. Such lower substrate temperature is a significant advantage in that it permits a method of depositing films on substrates that do not have thermal stability to accept coating by other methods. Additionally, PECVD can enhance the deposition rate when compared to thermal reactions alone and produce films of unique compositions and properties. Because of properties such as good adhesion, low pinhole density, good step coverage, adequate electrical properties and compatibility with fine line pattern transfer processes, this process has been used in integrated circuit manufacturing.

There are primarily three types of PECVD reactors: parallel plate, horizontal tube and single wafer. In a parallel plate reactor, the substrates or wafers are supported on a bottom grounded electrode and RF power is applied to an upper electrode. The grounded electrode may be rotated and heated to enhance uniformity. The reactant gas flow may be introduced centrally and removed peripherally or the reverse. In a hollow tube PECVD reactor, a plurality of vertically oriented electrodes are stacked parallel with one another with alternating plates serving as the power and ground electrodes for the applied RF energy. The wafers are interleaved with the electrodes. Generally, the entire assembly must be withdrawn from the tube for loading and unloading.

A single wafer PECVD reactor may be load locked and offer cassette to cassette operation. Radiant heating of the wafer may be provided. The application of RF energy enhances the deposition process, as discussed above. An embodiment of this type of reactor includes a plurality of discrete gas dispersion heads disposed within a reactor for discharging a reactant gas to wafers disposed therebeneath upon a common plate. The use of such multiple heads provides a sequential station capability for deposition at each station.

The chemistry and operating parameters attendant the process described below and related chemical vapor deposition (CVD) processes are described in detail in a textbook entitled *Silicon Processing For the VLSI Era*, Volume I—Process Technology, by S. Wolf and R. N. Tauber, published by the Lattice Press of Sunset Beach, California in 1987; chapters 5 and 6 are noted in particular. Further related information has been published in an article entitled "Chemical Vapor Deposition Techniques" by T. M. Besmann, D. P. Stinton and R. A. Lowden in the November 1988 issue of MRS Bulletin and references cited therein.

SUMMARY OF THE INVENTION

A plurality of gas dispersion heads are vertically aligned with and set parallel to underlying heated wafer supporting susceptors. The combination of gas dispersion head configuration, parallelism between the gas dispersion head and the susceptor and downstream flow control provides a uniform outwardly radial gas flow along the wafer. A source of RF energy is electrically connected to the gas dispersion heads to concentrate an electrical plasma intermediate the gas dispersion heads and the respective susceptors whereby residual deposits within the chamber are minimized. A spider sequentially transports the wafers from susceptor to susceptor and a wafer handling apparatus, in combination with a load lock, replaces each processed wafer with an unprocessed wafer.

It is therefore a primary object of the present invention to provide a multi station single wafer chemical vapor deposition processor.

Another object of the present invention is to provide uniform radial flow of a reactant gas across a wafer in a reactor usable for PECVD, LPCVD or atmospheric CVD.

Yet another object of the present invention is to provide reactant gas flow control to minimize residual deposits.

Still another object of the present invention is to provide a single wafer plasma enhanced chemical vapor deposition reactor.

A further object of the present invention is to provide apparatus for symmetrically distributing RF energy about a susceptor supported wafer.

A still further object of the present invention is to provide rapid conductive heating of a wafer by a supporting susceptor.

A yet further object of the present invention is to provide adjustment mechanisms for setting each susceptor and for mutually aligning each gas dispersion head with its associated susceptor within a reactor through an access opening of an otherwise closed reactor.

A still further object of the present invention is to provide a method for controlling the flow of a reactant gas across the wafer during a CVD process.

A yet further object of the present invention is to provide a method for increasing the throughput of a multi station wafer CVD processor.

A still further object of the present invention is to provide a method for increasing the yield of a multi station CVD processor.

These and other objects of the present invention will become apparent to those skilled in the art as the description thereof proceeds.

BRIEF DESCRIPTION OF THE DRAWINGS

The present invention will be described with greater clarity and specificity with reference to the following drawings, in which:

FIG. 1 is a pictorial illustration of the major components of a multi station multi process CVD system for processing multiple single wafers;

FIG. 4 is a top view of the wafer transporting spider;

FIG. 5 is a partial cross sectional view taken along lines 5—5, as shown in FIG. 4;

DESCRIPTION OF THE PREFERRED EMBODIMENT

Figure 2:
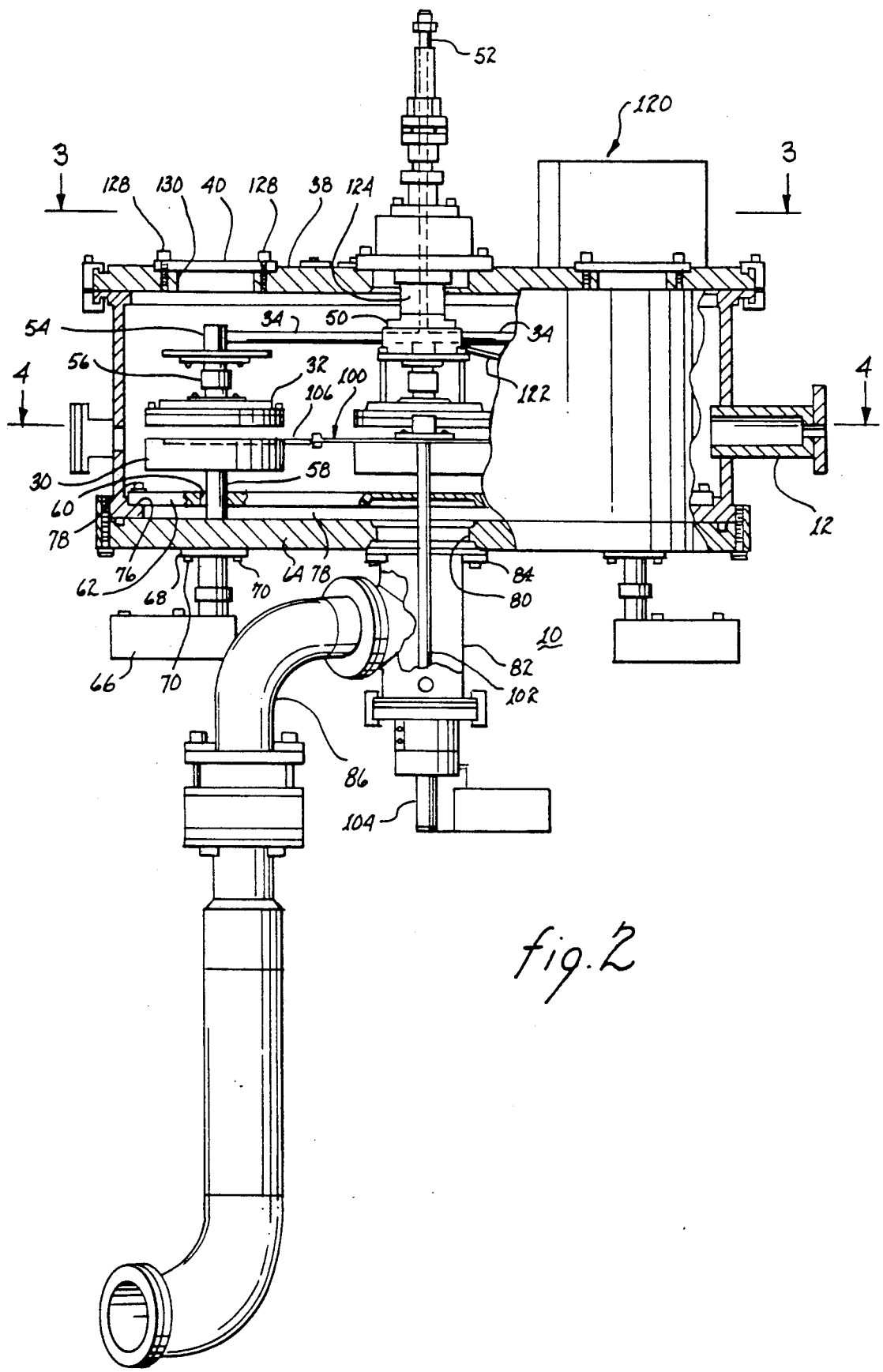
FIG. 2 illustrates a partial cross sectional view of the CVD reactor.

Referring to the pictorial illustration shown in FIG. 1, there is illustrated a reactor 10 constructed in accordance with the present invention. Under certain circumstances, a pair of reactors may be used at a work station, as illustrated. A port 12 of the reactor accommodates transport of the wafers into and out of the reactor. The port is in communication with a load lock apparatus 14 that includes a wafer handling mechanism 16. One or more input/output ports of which two (18,20) are shown, receive cassettes 22 containing wafers to be processed and wafers which have been processed. In operation, the wafer handling mechanism transports each wafer from the respective input/output port through port 12 into reactor 10. On completion of processing of a wafer, the wafer handling mechanism retrieves the processed wafer from the reactor through port 12 and deposits it in the respective cassette located within a respective input/output port.

Reactor 10 includes a plurality of equiangularly circularly arranged susceptors 30 for supporting respective ones of the wafers to be processed. A gas dispenser head 32, which is often referred to as a "shower head", is located vertically above and aligned with each susceptor. Each shower head is supported at the extremity of a radially extending hollow arm 34. Each arm is supported by and in fluid communication with a reactant gas distribution manifold, which manifold is connected to a source of reactant or other gas. A centrally located disk 36 includes a plurality of pairs of stalks; each pair of stalks supports a wafer during sequential transport of all of the wafers from one susceptor to an adjacent susceptor. Cover 38 of the reactor includes a plurality of removable hatches 40 to provide access to each susceptor/showerhead combination and to permit alignment and other adjustments after closing of the reactor. Depending upon production requirements and other criteria, a single wafer etch module 24 may be incorporated, as illustrated.

Particular features of reactor 10 will be described with reference to FIG. 2. Manifold 50, interconnecting each of arms 34, is in fluid communication with conduit 52 extending upwardly from cover 38 of the reactor. The conduit is connected via valves to a source of reactant gas and other gases, as is well known in the art. Manifold 50 distributes the flow of gas to each of arms 34 at a predetermined rate in accordance with preset parameters. A junction block 54 disposed at the extremity of arm 34 supports shower head 32 via an hollow bellows 56 while providing fluid communication between the arm and the interior of the shower head. Susceptor 30 includes a depending shaft 58. Because of the configuration of the susceptor and its shaft, it is sometimes referred to as a "mushroom". The shaft extends through aperture 60 concentric therewith and formed in plate 62. The shaft extends further downwardly through a passageway disposed in bottom plate 64 of reactor 10. The shaft is sealingly but not rigidly disposed within the passageway. Under certain circumstances, a suppressor 66 may be secured to bottom plate 64 via flange 68 and bolts 70 to receive the depending end of shaft 58 for purposes of reducing radio frequency interference. Plate 62 extends across reactor 10 and is supported upon a shoulder 76. The plate is secured upon the shoulder by a plurality of bolts 78 and means for effecting a seal between plate 62 and shoulder 76 may be employed. Exhaust chamber 78, formed between plate 62 and bottom plate 64, is in fluid communication with outlet 80 formed in the bottom plate. A downwardly depending conduit 82 is secured about outlet 80 by retention means 84. An exhaust pipe assembly 86, in fluid communication with conduit 82, conveys the exhausted reactant gas and other gases from reactor 10.

A spider assembly 100 includes disk 36 supported upon a shaft 102. The shaft is disposed generally concentric with conduit 82. Positioning means 104, which may be disposed at the lower end of conduit 82, vertically repositions shaft 102 to raise and lower spider 100; furthermore, positioning means 104 will incrementally rotate the shaft on command to effect incremental angular repositioning about the vertical axis of spider 100. The spider includes a pair of parallel stalks 106,108 associated with each susceptor. In the lowered position of spider 100, these pairs of stalks rest within commensurately configured grooves formed in the upper surface of each respective susceptor.

An RF generator 120 may be mounted upon cover 38 to provide a source of RF energy. Alternatively, item 120 may be an RF matching network with possibly more than one RF power input for multiple frequency operation. The RF energy is transmitted to manifold 50 via an electrically insulated conductor 122. A ceramic collar 124, interconnecting manifold 50 with cover 38 and providing for flow of gas therethrough, electrically isolates the manifold from the cover. Each of arms 34, junction blocks 54, bellows 56 and shower heads 32 are of electrically conductive material whereby each shower head serves as an electrode. Susceptor 30, being grounded to both plate 62 (through adjustable supports as will be described below) and bottom plate 64, is at ground potential. By varying the distance between shower head 32 and susceptor 30, the intensity of the radiant energy plasma therebetween can be regulated. Such regulation permits control of the distribution of radiant energy between the shower head and the susceptor. The intensity of radiant energy within the reactor exclusive of the electrical plasma intermediate the shower head and the susceptor can be minimized. As is well known, the power level of the RF energy can also be varied. Through such reduction of ambient radiant energy, residual deposition within the reactor is substantially reduced.

Under certain circumstances, it may be preferable to electrically isolate susceptor 30 and maintain it at an above ground potential. Under such circumstances, suppressor 66 may be used to eliminate spurious radiation exterior of reactor 10.

The positioning and alignment of shower head 32 relative to susceptor 30 is critical to uniform radial flow of the reactant gas upon the susceptor supported wafer. Moreover, the alignment therebetween will have a pronounced effect upon the distribution of the electrical plasma. Both the flow and the plasma have, in turn, a substantial effect upon the quality of wafer processing. To permit alignment and adjustment for these purposes, a hatch 40 is detachably attachable to cover 38 by fastening means 128 Each hatch overlies an opening 130 in cover 38, which opening is generally coincident with the vertical axis of the underlying shower head and susceptor combination. Through this opening, adjustments to align and calibrate the various components may be made.

Figure 3:
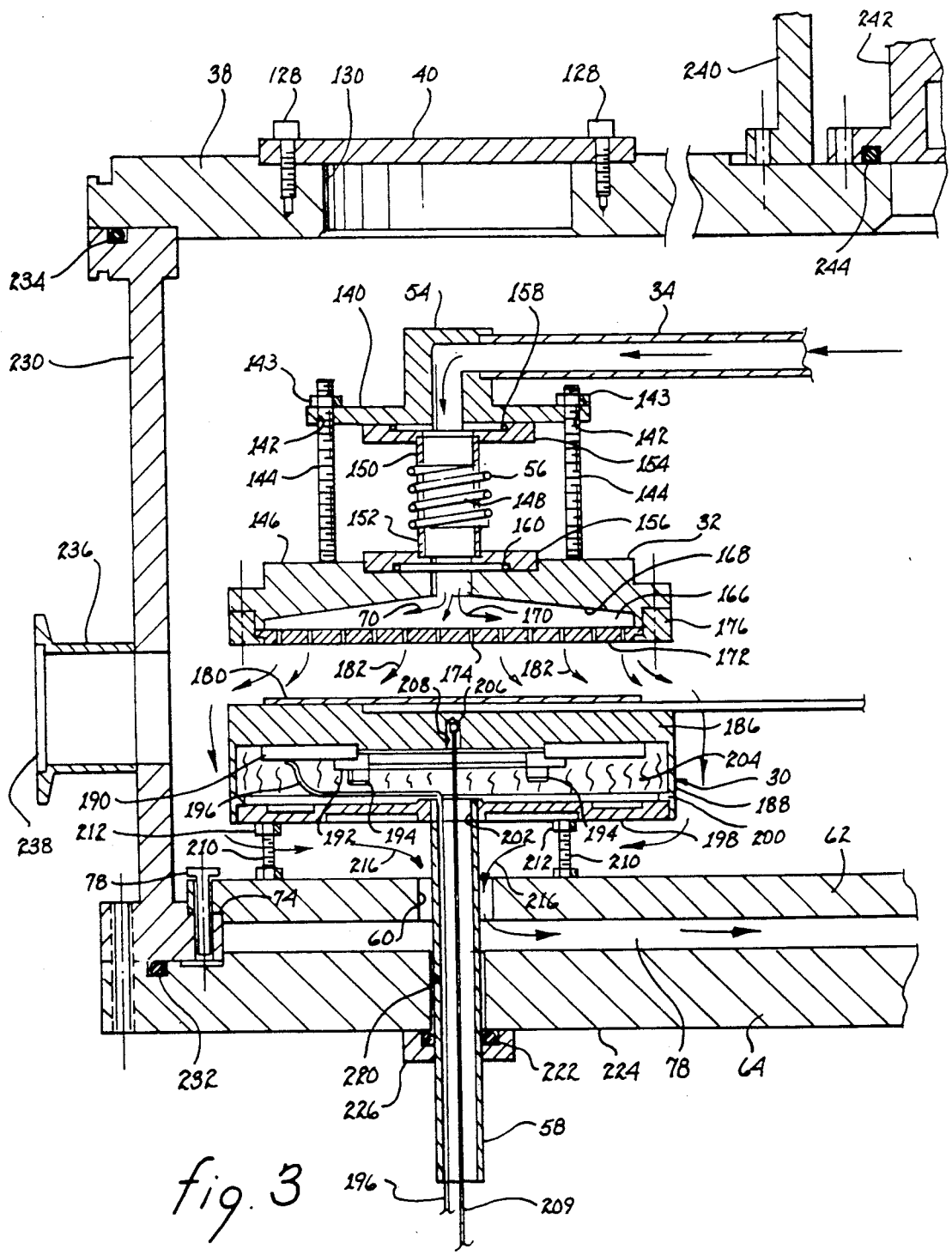
FIG. 3 is a cross sectional view of the components of one of the stations within the reactor.

Further details relating to the shower head and the susceptor will be described with particular reference to FIG. 3. Junction block 54 includes a laterally extending flange 140 having three threaded generally equiangularly displaced apertures 142 disposed proximate the perimeter of the flange. An adjustment screw 144 threadedly engages and depends from each threaded aperture 142 and is in pressure contact with upper surface 146 of shower head 32. Bellows 56 include's a coil spring 148 for drawing the shower head upwardly toward the junction block. Sleeve ends 150,152, extending in opposed directions from bellows 56, are attached to mounting plates 154,156, respectively. Mounting plate 154 is secured to flange 140 and an O-ring 158 may be employed to prevent leakage therebetween. Mounting plate 156 is secured to shower head 32 and O-ring 160 may be employed to prevent leakage therebetween.

Shower head 32 includes a cylindrical cavity 166, which cavity may include a cone shaped upper end section to assist in radially dispersing the reactant gas flowing thereinto from within bellows 56, as indicated by arrows 170. A diffusion plate 172 having a multiplicity of apertures 174 extends across the lower end of cavity 166. The diffusion plate may be secured in place by a ring 176. The reactant gas flowing into cavity 166 is dispersed through apertures 174 downwardly toward wafer 180 and radially outwardly therealong, as depicted by arrows 182.

Susceptor 30 includes an inverted can like structure, preferably of aluminum or other thermal conducting material, having a relatively thick base 186 and a cylindrical depending sidewall 188. An electrically energized heater ring 190 is located adjacent the underside of base 186. It is retained in place by a retention ring 192 secured to the base via bolt means 194. An electrical conductor 196 extends from heater ring 190, through shaft 58 to a source of electrical energy for providing electrical power to the heater ring. A bottom cover plate 198 is retained in side wall 188 and bears against a radial flange 200 Shaft 58 is welded or otherwise penetrably secured within central aperture 202 disposed within bottom plate 198. A thermal insulating composition 204 is disposed within the remaining space intermediate bottom plate 198 and base 186 to reduce heat transfer to the bottom plate and the depending side wall. A thermocouple 206 is disposed in a cavity 208 in base 186 to provide temperature related information via an electrical conductor 209 extending through shaft 58. Three threaded stanchions 210 extend upwardly from plate 62 to support susceptor 30 and to secure the susceptor to the plate. Adjustment/lock means, such as an adjustment/lock nut 212, is associated with each stanchion to permit horizontal alignment and vertical positioning of the susceptor. It is to be understood that the stanchions also maintain the susceptor securely attached to plate 62. Aperture 60, formed in plate 62, is concentric with shaft 58 and dimensioned to provide an annular passageway for the flow of partially or fully depleted reactant gas, as indicated by arrows 216, into exhaust chamber 78 formed by plate 62 and bottom plate 64.

During processing, the interior of reactor 10 is at a low, near vacuum, pressure; it may be in the range of 500 milli torr to 5 torr but is typically at a pressure of 1½-2 torr. Because of the pressure differential between the interior of the reactor and the normal atmospheric pressure surrounding the reactor, plate 64 will bow. Were susceptors 30 secured to bottom plate 64, the bowing of the bottom plate, during processing, would angularly realign and vertically reposition the susceptors. Such realignment and vertical repositioning, even though slight, would have a deleterious effect upon the uniformity of deposition on the wafer(s) being processed. To attempt to align or adjust accurately the susceptor to accommodate the expected, or even measured, bowing of bottom plate 64 would be an almost impossible task and certainly it would be impossible to achieve the degree of alignment sought in reactor 10. To avoid this problem area, each susceptor is, as described above, supported on plate 62. This plate has substantially equal pressure acting upon its top and bottom surfaces. Therefore, it will remain rigid and planar prior to and during operation of the reactor. Accordingly, alignment of the supported susceptors will not be altered in response to or as a consequence of a change in pressure within the reactor. To permit bowing of bottom plate 64 without affecting the alignment of susceptors 30, passageway 220 extending through the bottom plate for penetrably receiving shaft 58 is sufficiently larger in diameter than the shaft to permit bowing of the bottom plate without having the wall of passageway 220 contact the shaft. To seal the passageway, an O-ring 222 is disposed about the shaft adjacent under surface 224 of bottom plate 64. The O-ring is retained in place by a collar 226. A seal of this type is effective in maintaining the interior of reactor 10 at its operating pressure and yet vertical movement and angular realignment of shaft 58 will be accommodated in response to manipulation of stanchions 210 and adjustment/lock means 212.

Reactor 10 includes a cylindrical side wall 230 interconnecting cover 38 and bottom plate 64. Necessarily, an O-ring 232 or similar sealing means is disposed between the cylindrical side wall and the bottom plate. Further O-ring 234 or other sealing means is disposed intermediate the cylindrical side wall and the cover to effect a seal therebetween. One or more viewing ports having a transparent window 238 of quartz or other compatible material may be formed in cylindrical side wall 230. This viewing port may be employed for alignment and adjustment purposes of the shower head and the susceptor; it may be used to view the deposition process in effect upon wafer 180, for in situ measurements or for diagnostic purposes.

Cover 38 may include an inverted U shaped bracket 240 for handling and support purposes. A support shroud 242 is attached to and extends upwardly from the center of cover 38 to support conduit 52 and provide support therefor. The support shroud can also provides fluid communication intermediate the bore of ceramic cylinder 124 and conduit 52. Annular sealing means, such as O-ring 244, is disposed between the support shroud and the cover to prevent leakage therebetween.

The structure and operation of spider 100 will be described with particular reference to FIGS. 4 and 5. The spider, mounted upon vertically positionable and incrementally rotatable shaft 120 (see FIG. 2) may include a single disk or a pair of parallel spaced apart disks for supporting pairs c,f stalks 106,108. These stalks are secured by positioning means, such as machine screws 110, to locate and maintain the stalks parallel and equispaced on opposed sides of a diametric lire of disk 100. Base 186 of each susceptor 30 includes a pair of grooves 250,252 disposed in upper surface 254. These grooves are in alignment with the respective pair of stalks 106,108. Moreover, the grooves are somewhat wider than the width of the stalks to permit some angular positioning tolerance of disk 36. The grooves are somewhat deeper than the height of the stalks to permit wafer 180 to lie flat upon surface 254 of the susceptor when spider 100 is in its lowered position.

In operation, after each vapor deposition phase or cycle, spider 100 is raised resulting in commensurate vertical repositioning of pairs of stalks 106,108. Each pair of rising stalks will lift up any overlying wafer. Necessarily, the pairs of stalks must extend a sufficient distance under each respective wafer to provide an adequate and balanced lifting force to prevent inadvertent radially outward tilting of the wafer. By further operation of positioning means 104 (see FIG. 2), spider 100 is incrementally angularly rotated about the vertical axis to position each pair of stalks in an overhead position with respect to an adjacent susceptor. Further actuation of positioning means 104 will lower the spider resulting in placement of the pair of stalks in grooves 250,252 of the adjacent susceptor. Each wafer will then have been relocated to the next adjacent susceptor. Depending upon the cycling sequence, wafer handling mechanism 16 (see FIG. 1) will enter reactor 10 through port 12 to withdraw a processed wafer from the susceptor in radial alignment with the port. After such withdrawal, the wafer handling mechanism will load a wafer to be processed upon the same susceptor still proximate port 12. Accordingly, after each phase or cycle of operation of reactor 10, a processed wafer is withdrawn. This withdrawal and loading capability provides a relatively rapid throughput not available from any of the prior art related reactors. In particular, the additional ports in the central loader (see FIG. 1) permit the use of multiple parallel or sequential reactors. Necessarily, upon initial loading, a wafer is placed sequentially upon each susceptor and a cycle of the process can be performed intermediate each wafer loading.

Figure 6:
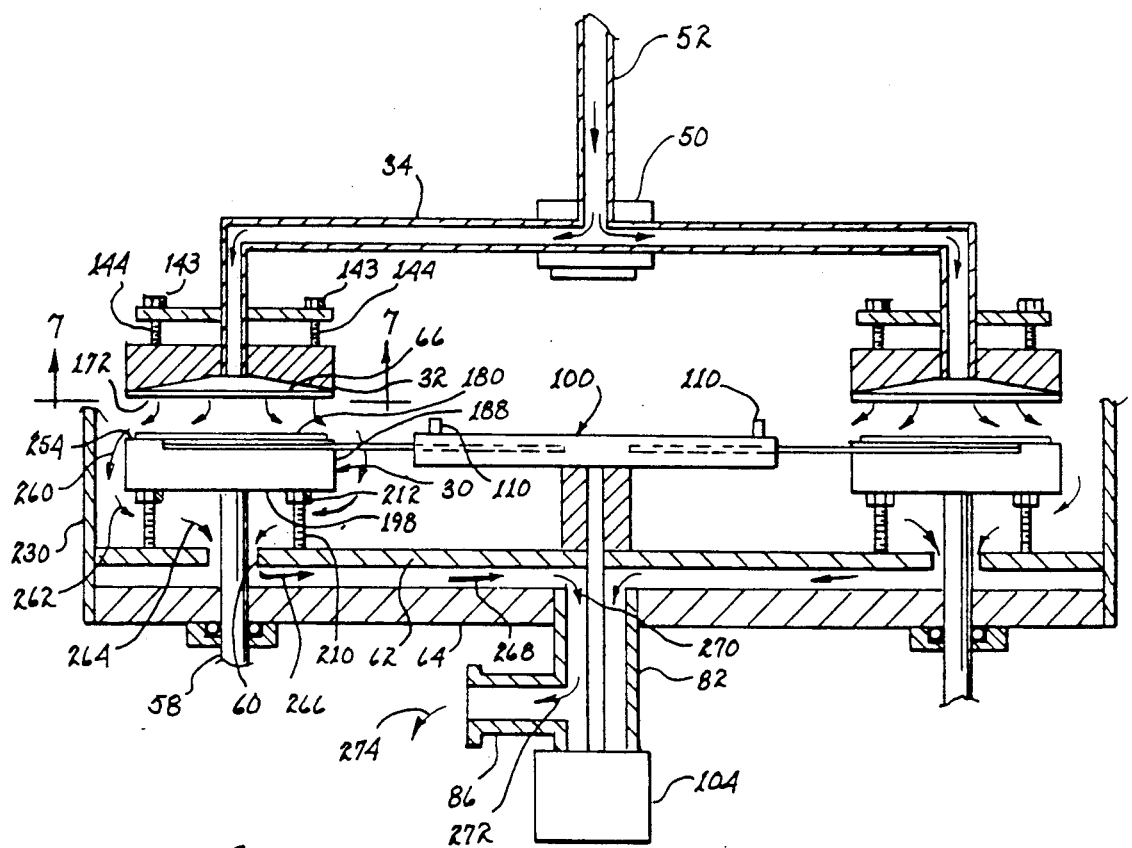
FIG. 6 is a partial cross sectional view of the reactor.
Figure 7:
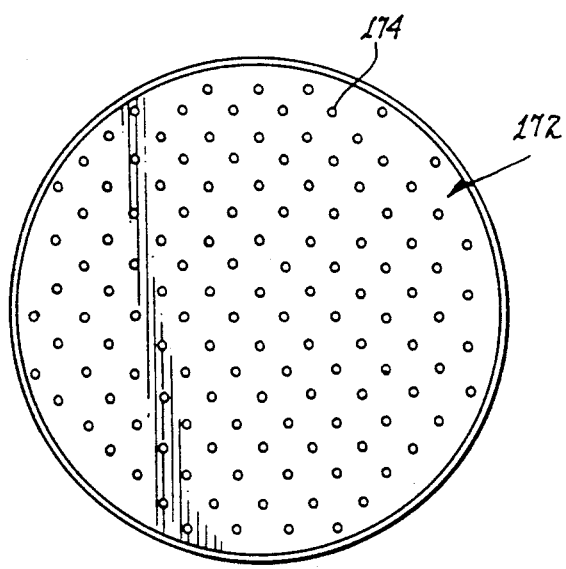
FIG. 7 is a view taken along line 7—7, as shown in FIG. 6.

Referring to FIGS. 6 and 7, further details attendant the alignment capability and flow path control will be described. For sake of simplicity, certain details attendant earlier figures have been deleted. Conduit 52, in fluid communication with any of various sources of reactant or other gases, conveys the gas to manifold 50. Manifold 50 distributes the gases evenly into each of hollow equiangularly extending arms 34. From each arm, the gas is conveyed to cavity 66 in each of shower heads 32. Each diffusion plate 172 includes a plurality of apertures 174; the number, arrangement and size of these apertures may be varied, individually or collectively, to assist in providing better flow control of the gas across underlying wafer 180. The only outflow possible from within the space defined by side wall 230, cover 38 and plate 62 is via passageway 60 surrounding each shaft 58. Accordingly, the gas flow from shower head 32 will flow downwardly to wafer 180 and radially outwardly therealong to the circular edge of susceptor 30. The flow will be downwardly adjacent side wall 188 and inwardly beneath bottom cover plate 198. From beneath the susceptor, the flow will be downwardly about shaft 58 through passageway 60. This flow pattern is depicted by arrows 260,262 and 264. Once the gas enters the space between plate 62 and bottom plate 64, it will flow radially inwardly into exhaust pipe assembly 86 via conduit 82. This flow is depicted by arrows 266,268,270,272 and 274. From this description, it will be evident that substantial control of the flow path of the gas is achieved. Moreover, the parameters controlling the flow path strongly discourage incidental and spurious flow within the reaction chamber. Thereby, residual deposits will be minimized.

It may be pointed out that due to the thermal insulation within susceptor 30, described above, bottom cover plate 198 will be substantially cooler than wafer supporting surface 254 and the likelihood of residual deposit upon the underside of the susceptor is reduced. Moreover, side wall 188 will exhibit a substantial temperature gradient from top to bottom and residual deposit upon the lower part of the side wall will be reduced. Moreover, the electrical plasma is substantially less adjacent the underside of the susceptor and the susceptor side wall, which further reduces the likelihood of residual deposit.

Figure 8:
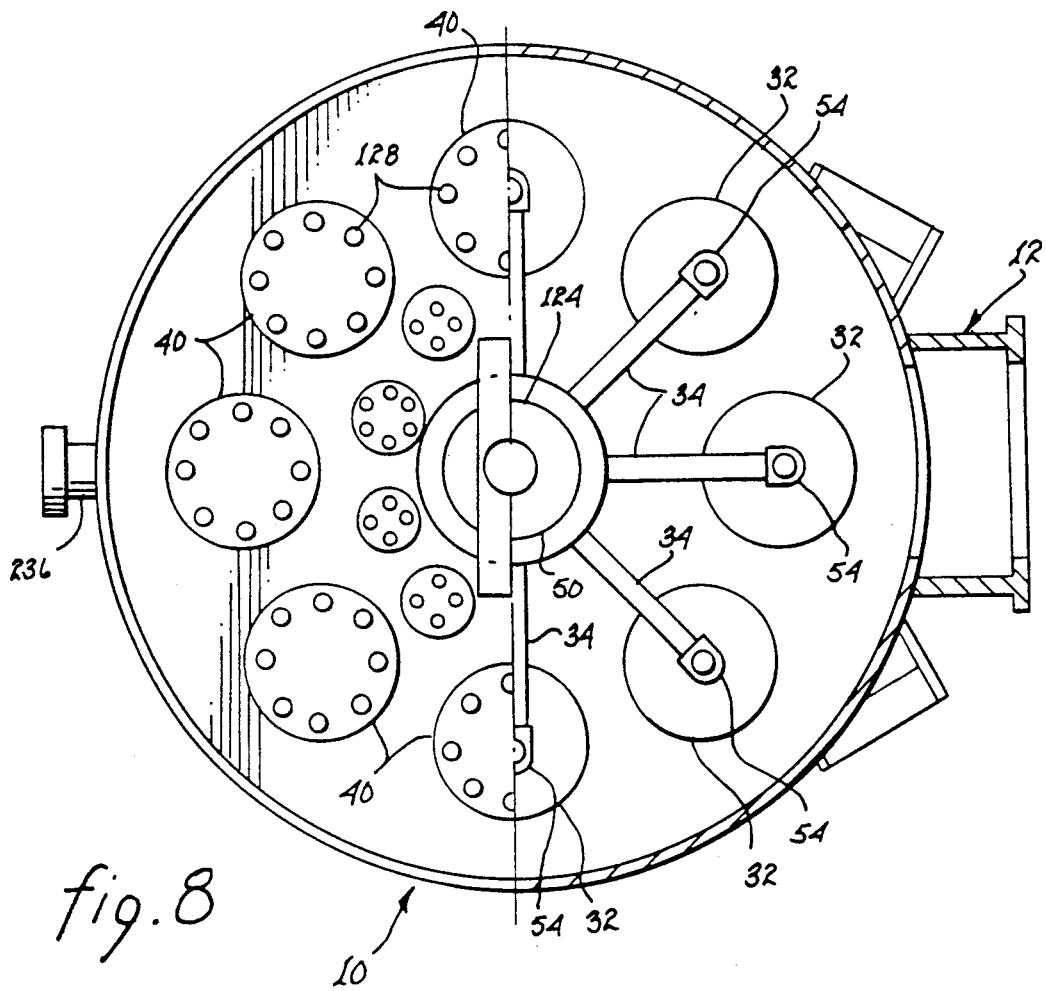
FIG. 8 is a partial top view of the reactor.

As previously described, adjustment means, as shown in FIG. 6, are provided to position susceptor 30 as a reference and thereafter showerhead 32 is aligned therewith. Referring jointly to FIGS. 6 and 8, this alignment procedure will be described in further detail. As depicted in the superimposed view shown in FIG. 8, each of hatches 40 is aligned with a showerhead/susceptor pair. Upon removal of a hatch by undoing fastening means 128, manual access to adjustment/lock means 212 attendant stanchions 210 of the susceptor is available. The susceptor can then be trued with respect to plate 62 by use of feeler gauges, positioning jigs, and the like and locked in place by adjustment/lock means 212. Once the susceptor is located as a reference, the shower head is aligned to locate the lower surface of diffusion plate 172 parallel with surface 254 of the susceptor. Such alignment is effected by turning one or more of the three adjustment screws 144 in combination with the use of feeler gauges, positioning jigs, or the like. When alignment is obtained, the adjustment screws are locked by lock nuts 143.

As discussed above, bottom plate 64 will bow as a result of the pressure differential between the interior of the reaction chamber and ambient pressure. Similarly, cover 38 may bow. Such bowing of cover 38 will cause vertical repositioning of manifold 50 from which arms 34 extend. Such vertical repositioning of the arms will provide a commensurate and uniform vertical repositioning of each of the shower heads. However, the alignment between a shower head and its paired susceptor will remain constant because the bowing of cover 38 will not result in angular displacement of the vertical axis of manifold 50. By experiment and/or calculation, the amount of bowing of cover 38 which will occur commensurate with certain pressure differences between the interior of reactor 10 and the ambient pressure can be determined. With such information, the initial vertical position of each shower head can be set such that upon bowing of cover 38, the shower head will be in the preferred vertical relationship with respect to its paired susceptor.

Figure 9:
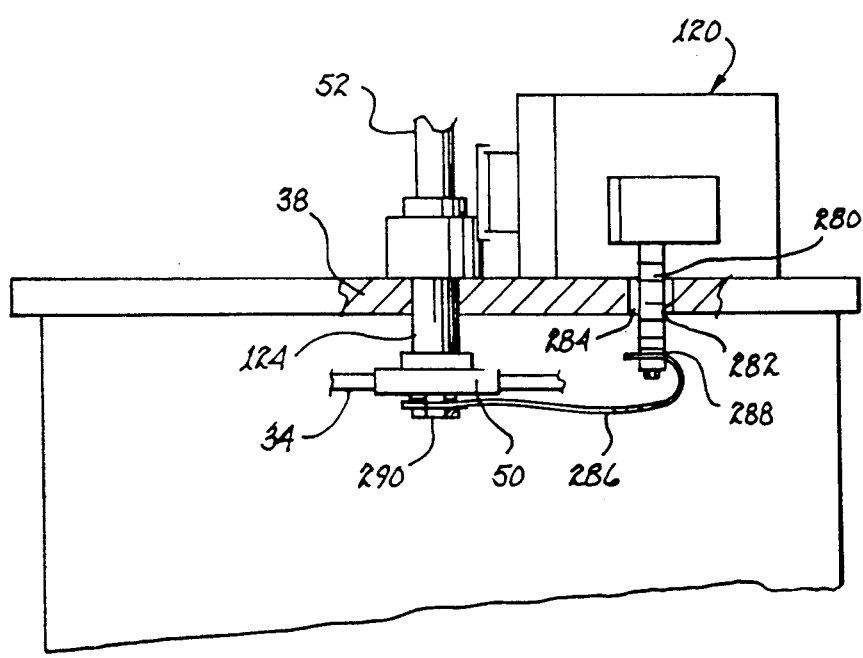
FIG. 9 is a partial cross sectional view illustrating the RF generator and associated conductor.

Referring to FIG. 9, there is shown further detail attendant the electrical connection between RF generator 120 and manifold 50. The RF generator includes an electrically insulated conductor 280 penetrably extending through aperture 282 in cover 38. Necessarily, sealing means 284 must be employed to prevent gas flow intermediate the conductor and the aperture. One end of a flexible ribbon conductor 286 is electrically connected to terminal end 288 of conductor 280. The other end of the ribbon conductor is electrically connected to a post 290 extending from the underside of manifold 50. As the manifold, arms 34, bellows 56 and shower heads 32 are of conductive material, they form, as a unit, an electrode. Ceramic cylinder 124, interconnecting manifold 50 with conduit 52, electrically insulates the manifold from the conduit and cover 38. As the reactor housing is at ground potential, it serves as a second electrode. Susceptor 30, being mechanically and electrically connected with the housing of the reactor, will be at ground potential. Because of the relatively small spacing between the susceptor and the shower head during operation of the reactor, a substantial electrical gradient and electrical plasma will exist between the shower head and the susceptor. This electrical plasma will enhance the rapidity and uniformity of deposition. Moreover, because of the dimensional equivalence between surface 254 of the susceptor and the bottom of the shower head, the RF distribution therebetween is optimized for enhanced uniformity in excitation of the reactant gas. The RF energy present elsewhere within reactor 10 will be at a substantially reduced intensity and residual deposits will be minimal.

In summary, the configuration of the high throughput single wafer multistage processor described herein provides outstanding flow control of the reactant and other gases to achieve high deposition uniformity. Symmetric distribution of the RF energy is available by using physically matching mating pairs of shower heads and susceptors as the electrodes. The gas flow control downstream of the wafer encourages uniform radial outward flow across the wafer. As each susceptor has its own heater, temperature variations between susceptors are readily achieved for particular processing recipes. The adjustment features available for both the susceptors and the showerheads insures rapid setup time and adjustment capability commensurate with the process to be performed or recipe to be followed. Because of the limited residual deposits that will occur as a result of the flow control achieved, self cleaning by etching is available.

Flow pattern uniformity and temperature distribution uniformity are critical to low pressure chemical vapor deposition processes. The flow control available and temperature distribution through conduction at the base of the susceptor are sufficient to effect low pressure chemical vapor deposition (LPCVD) with the above described reactor. That is, plasma enhancement is not critical to operation of reactor 10 and the reactor can be used as a LPCVD processor.

While the principles of the invention have now been made clear in an illustrative embodiment, there will be immediately obvious to those skilled in the art many modifications of structure, arrangement, proportions, elements, materials and components used in the practice of the invention which are particularly adapted for specific environments and operating requirements without departing from those principles.

We claim:

1. A method for processing multiple single wafers in a multi station CVD reactor having a number of susceptors equal in number to the number of stations, which stations are disposed in a common chamber of the reactor, said method comprising the steps of:
    a) supporting one wafer on a susceptor;
    b) dispersing a gas upon the supported wafer from a gas dispersion head associated with the wafer supporting susceptor; and
    c) urging outward radial flow of the gas across each supported wafer to the peripheral edge of the gas dispersion head; and
    d) drawing the gas from the peripheral edge of the wafer, along the side of the susceptor and into an exhaust chamber having an opening centrally aligned with the susceptor.

2. The method as set forth in claim 1 including the step of heating the wafer with heat generated by the susceptor.

3. The method as set forth in claim 1 including the step of irradiating the wafer with RF energy.

4. The method as set forth in claim 3 including the step of heating the wafer with heat generated by the susceptor.

5. The method as set forth in claim 3 including the step of radiating RF energy from the gas dispersion head to the susceptor.

6. The method as set forth in claim 1 wherein a plurality of susceptors, each with an associated gas dispersion head, are located circularly within the reactor and including the step of sequentially repositioning the wafers from one susceptor to another susceptor.

7. The method as set forth in claim 6 including the step of loading unprocessed wafers into the reactor.

8. The method as set forth in claim 6 including the step of withdrawing processed wafers from the reactor.

9. The method as set forth in claim 8 including the step of loading unprocessed wafers into the reactor.

10. The method as set forth in claim 6 wherein said step of repositioning is performed on completion of each process cycle.

11. The method as set forth in claim 6 including the step of withdrawing a wafer from the reactor on completion of each process cycle.

12. The method as set forth in claim 11 including the step of loading a wafer into the reactor prior to initiation of a process cycle.

13. The method as set forth in claim 6 including the step of drawing the gas from the perimeter of each wafer along the side of the respective susceptor and into an exhaust chamber having an opening centrally aligned with each susceptor.

14. The method as set forth in claim 13 including the step of radiating RF energy from each of the gas dispersion heads to irradiate the gas flowing from each of the gas dispersion heads and across the wafer supported on the associated susceptor.

15. The method as set forth in claim 1 including the steps of channeling the gas to each gas dispersion head from a common source of gas.

16. The method as set forth in claim 1 including a first step of adjusting and aligning the susceptor, a second step of adjusting and aligning the gas dispersion head relative to its associated susceptor, and the step of performing said first and second adjusting and aligning steps through an openably closeable opening in the reactor and after assembly of the reactor.

17. A method for processing multiple single wafers in a multi station CVD reactor having a number of susceptors equal in number to the number of stations, which stations are disposed in a common chamber of the reactor, said method comprising the steps of:
   a) supporting one wafer on a susceptor;
   b) dispersing a gas upon the supported wafer from a gas dispersion head associated with the wafer supporting susceptor;
   c) urging outward radial flow of the gas across each supported wafer to the peripheral edge of the gas dispersion head; and
   d) supporting each susceptor upon an intermediate plate disposed within the common chamber of the reactor and which intermediate plate is not subject to flexing in response to changes in pressure within the common chamber.

18. The method as set forth in claim 17 wherein said step of supporting includes the step of adjusting the parallelism between each susceptor and its associated gas dispersion head.

19. The method as set forth in claim 17 wherein each susceptor is secured to the end of a shaft, which shaft extends through an aperture within the intermediate plate and sealingly penetrates the bottom of the reactor and including the step of drawing the gas uniformly across the peripheral edge of the gas dispersion head, along the shaft and through the aperture in the intermediate plate.

20. The method as set forth in claim 19 including the steps of exhausting the gas flow from each aperture through a common outlet of the reactor.

21. A method for processing multiple single wafers in a multi station CVD reactor having a number of susceptors equal in number to the number of stations, which stations are disposed in a common chamber of the reactor, said method comprising the steps of:
   a) supporting one wafer on a susceptor;
   b) dispersing a gas upon the supported wafer from a gas dispersion head associated with the wafer supporting susceptor; and
   c) urging outward radial flow of the gas across each supported wafer to the peripheral edge of the gas dispersion head; and
   d) isolating each susceptor from movement due to flexing of the walls, top and bottom of the reactor during pressure changes within the common chamber.

22. The method as set forth in claim 21 including a first step of adjusting and aligning each susceptor, a second step of adjusting and aligning the gas dispersion head relative to its associated susceptor and the step of performing said first and second adjustment and aligning steps through at least one openably closeable opening in the rector after assembly of the reactor.

23. A method for simultaneously processing in accordance with a predetermined recipe multiple single wafers within a common chamber of a CVD reactor having a number of susceptors equal in number to the number of stations, said method comprising the steps of:
   a) supporting one wafer on one side of a susceptor;
   b) dispersing a gas upon the supported wafer from a gas dispersion head associated with the wafer supporting susceptor;
   c) drawing the gas discharged from each gas dispersion head across the perimeter and lateral side of the associated susceptor to a location proximate the other side of the susceptor, said step of drawing including the step of urging uniformity of gas flow across both the perimeter and the lateral side of the associated susceptor to urge uniform outward radial flow of gas across the wafer.

24. The method as set forth in claim 23 wherein said step of urging includes the steps of directing the gas flow from the lateral side of each susceptor through an opening centrally aligned with the other side of the susceptor.

25. The method as set forth in claim 23 including the step of isolating each susceptor from movement due to flexing of the walls, top and bottom of the reactor during pressure changes within the common chamber of the reactor.

26. The method as set forth in claim 25 wherein said step of isolating includes the step supporting each susceptor upon an intermediate plate disposed within the common chamber of the reactor.

27. The method as set forth in claim 26 wherein said step of supporting includes the steps of adjusting the parallelism between each susceptor and its associated gas dispersion head.

28. The method as set forth in claim 26 wherein said step of urging includes the step of directing the gas flow from the lateral side of each susceptor through an opening disposed within the intermediate plate and centrally aligned with the other side of the susceptor.

29. The method as set forth in claim 28 including the step of exhausting the gas flow from each opening through a common outlet of the reactor.

* * * * *